United States Patent [19]

Redman-White

[11] Patent Number: 5,745,007
[45] Date of Patent: Apr. 28, 1998

[54] CMOS DIFFERENTIAL AMPLIFIER HAVING CONSTANT TRANSCONDUCTANCE AND SLEW RATE

[75] Inventor: William Redman-White, West Wellow, England

[73] Assignee: U.S. Philips Corporation, New York, N.Y.

[21] Appl. No.: 691,775

[22] Filed: Aug. 2, 1996

[30] Foreign Application Priority Data

Aug. 4, 1995 [GB] United Kingdom ............... 9516025

[51] Int. Cl.$^6$ .................................................. H03F 3/45
[52] U.S. Cl. ........................................ 330/253; 330/258
[58] Field of Search ................................. 330/252, 253, 330/258, 261

[56] References Cited

U.S. PATENT DOCUMENTS

| | | | |
|---|---|---|---|
| 4,555,673 | 11/1985 | Huijsing et al. | 330/258 |
| 4,766,394 | 8/1988 | Yukawa | 330/253 |
| 4,918,398 | 4/1990 | Huijsing et al. | 330/252 |
| 5,032,797 | 7/1991 | Mijuskovic | 330/353 |
| 5,208,552 | 5/1993 | Ryat | 330/253 |
| 5,294,892 | 3/1994 | Ryat | 330/253 |
| 5,311,145 | 5/1994 | Huijsing et al. | 330/255 |
| 5,323,120 | 6/1994 | Ryat | 330/252 |
| 5,371,474 | 12/1994 | Wassenaar et al. | 330/253 |
| 5,384,548 | 1/1995 | Sakurai et al. | 330/253 |

FOREIGN PATENT DOCUMENTS

| | | | |
|---|---|---|---|
| 0394702A2 | 10/1990 | European Pat. Off. | H03G 5/22 |
| 0394703A2 | 10/1990 | European Pat. Off. | H03F 3/45 |
| 0499554A1 | 8/1992 | European Pat. Off. | H03F 3/45 |
| 0606144A1 | 7/1994 | European Pat. Off. | H03F 3/45 |

OTHER PUBLICATIONS

"A Low–Voltage CMOS Op Amp With A Rail–to–Rail Constant–gm Input Stage and A Class AB Rail–to–Rail Output Stage", by J.H. Botma et al, MESA Research Ins., The Netherlands, IEEE, 1993, pp. 1314–1317.

Primary Examiner—James B. Mullins
Attorney, Agent, or Firm—Leroy Eason

[57] ABSTRACT

An amplifier, particularly a CMOS amplifier has a differential input which is fed to six differential pairs. The outputs of the first and third differential pair are combined and fed to inputs of a summing network, while the outputs of the fourth and fifth are combined and fed to inputs of the summing network. The second and sixth differential pairs are arranged to cancel the tail currents of the fifth and third pairs, respectively, when all of the devices are in their active state. Thus, regardless of the common mode input level with respect to the supply rails the output current is provided by four devices giving a constant $g_m$ and slew rate.

6 Claims, 1 Drawing Sheet

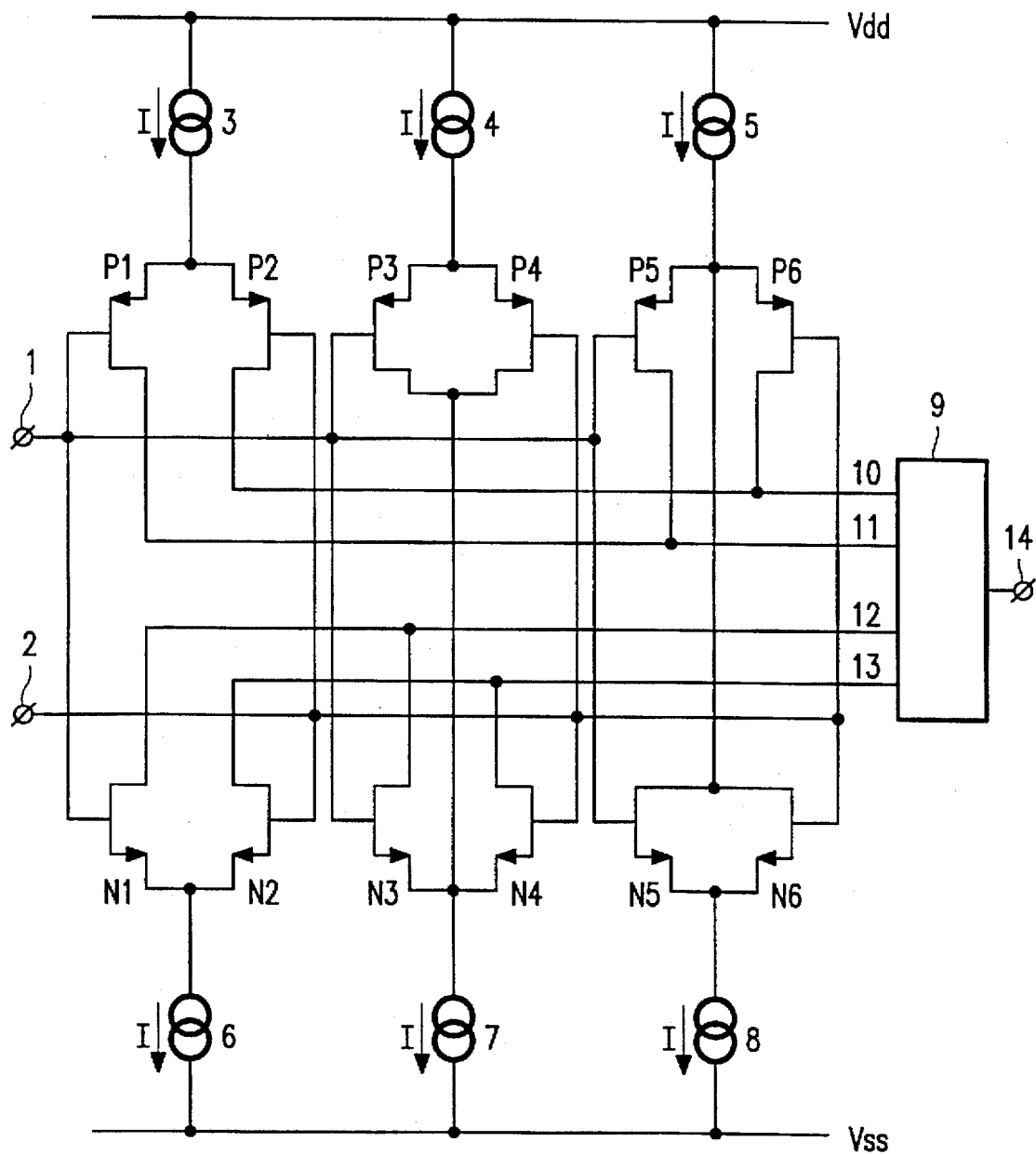

CMOS DIFFERENTIAL AMPLIFIER HAVING CONSTANT TRANSCONDUCTANCE AND SLEW RATE

BACKGROUND OF THE INVENTION

1. Field of the Invention

The invention relates to an amplifier and in particular to an input structure therefor comprising first and second differential pairs of opposite conductivity type.

2. Description of the Related Art

There is an increasing need for circuit architectures that will yield good analogue performance in circuits operating with low supply voltages and particularly in CMOS circuits. Modern sub-micron processes stipulate 3.3 volts as the nominal supply voltage. For most amplifier structures this poses a problem. Conventional differential pair inputs can only operate with a common mode offset from one of the power supply rail voltages sufficient to allow the amplifying transistors and the tail current source to be in an active state. This implies for MOS transistors a minimum of $V_T+2Vd_{sat}$ from one rail ($V_{dd}$ for a P-channel input or $V_{ss}$ for an N-channel input). This is a severe limitation on systems design where signal voltages should ideally be kept large to maintain a good signal to noise ratio.

One proposed solution is to use two differential pairs, one P-channel and one N-channel and to connect them in parallel in a signal sense. To achieve this the gates of the two differential pairs are simply connected to the inputs and a folded cascode or similar structure is used to sum the resulting output currents. Hence, when the common mode input signal value is low, the N-channel pair will be turned off but a signal will be present due to the P-channel pair. When the input common mode value is near $V_{dd}$ the converse situation applies. When the input is near to $V_{dd}/2$ both differential pairs are delivering signal current to the summing circuit. Such an arrangement is described in a paper entitled "A compact power efficient 3V CMOS rail-to-rail input/output operational amplifier for VLSI cell libraries" by R. Hogervorst, J. R. Tero, R. G. H. Eschauzier and J H Huijsing, published in IEEE Journal of Solid State Circuits, Vol. 29, No. 12, December 1994.

There are two drawbacks to the aforesaid basic idea. First, the effective small signal transconductance of the stage varies with the common mode value of the incoming signal. At each extreme the transconductance will be one half of that in the mid range. This is due to there being only one pair of devices active in the regions near each supply rail. This has an impact on the usability of the circuit since when used as a transconductor the proportionality is varying with signal value and when used as an operational amplifier there is now the problem that the compensation system for closed loop stability will not be well defined and the phase margin will be signal level dependent.

The second problem concerns the large signal behaviour. With a large differential input signal there is normally a well defined maximum current from a normal differential pair which sets the slew rate in amplifiers and the response time in comparators, where a transconductor is often used to drive a single ended current integrator (typically just a CMOS invertor). The simple dual differential pair has a maximum slew rate of I, where I is the tail current of each of the differential pairs, when the common mode input is near each power rail since the opposing tail current source will be turned off. In the mid range when both differential pairs are active the maximum slew rate current is 2I.

The arrangement proposed by Hogervorst et. al. in the paper referenced above attains a relatively constant $g_m$ in the following manner. Because for moderate biases the $g_m$ of a MOS transistor is proportional to the square root of its drain current, the loss of the total $g_m$ when only one pair is active may be compensated by increasing the current in the active pair by the ratio of 4:1, hence doubling its $g_m$. This is achieved by means of two control loops which sense the current in each pair. The switch-off point for each differential pair is detected by a current steering circuit, and the unused tail current is sent to a multiplying mirror. This then feeds an additional current of 3I to the opposing active pair.

This gives a good control of the transconductance but two problems still remain. First the total current available for slewing is still not constant and will increase by a factor of two when the input common mode signal is near the power supply rails. Secondly, the control system requires current to flow through a circuitous loop with current mirrors of inherently limited bandwidth which will limit the frequency of common mode signal that can be handled.

SUMMARY OF THE INVENTION

It is an object of the invention to enable the production of an amplifier arrangement which may be used with low supply voltages and in which the effect of one or more of the disadvantages set out above may be mitigated.

The invention provides an amplifier comprising differential input means, a plurality of differential pairs of active devices of a first conductivity type, a plurality of differential pairs of active devices of a second conductivity type, means for connecting the differential input means to the inputs of the differential pairs, and means for combining the outputs of the differential pairs. For all values of the input signal the same total tail current flows through the same effective differential pair device sizes, allowing for scaling between devices of the first and second conductivity types.

By ensuring that the same total tail current flows through the same effective differential pair sizes, a substantially constant $g_m$ and slew rate can be achieved over the whole input signal voltage range. It will be apparent to the person skilled in the art that when using MOS transistors as the active devices the p and n channel devices have to be scaled to obtain the same device parameters, i.e. the actual sizes are different but the transconductances are equal.

The invention further provides an amplifier comprising first, second, and third differential pairs of active devices of a first conductivity type having first, second, and third tail currents respectively, and fourth, fifth, and sixth differential pairs of active devices of a second conductivity type having fourth, fifth, and sixth tail currents respectively. Each of said differential pairs has its inputs coupled to the inputs of the amplifier, the outputs of the first, third, fourth, and fifth differential pairs are coupled to inputs of a summing network whose output is coupled to the output of the amplifier, the outputs of the second differential pair are commoned and connected to the tail of the fifth differential pair, the outputs of the sixth differential pair are commoned and connected to the tail of the third differential pair, the tail current of the second differential pair is equal to that of the fifth differential pair, and the tail current of the third differential pair is equal to that of the sixth differential pair.

The action of the first, third, fourth, and sixth differential pairs ensures that the large signal output current and the total transconductance is held substantially constant regardless of whether devices of both the conductivity types are active or whether devices of one of the conductivity types are cut off. This is achieved without the use of current mirrors and is achieved by means of a feed forward technique, thus reducing stability and bandwidth problems.

In one implementation the active devices are p-channel and n-channel MOS transistors. The amplifier may be such that all the p-channel transistors are identical, all the n-channel devices are identical, and the devices are constructed so that the p-channel devices have the same nominal transconductance as the n-channel devices, the tail current of the third differential pair being equal to the tail current of the sixth differential pair and the tail current of the fifth differential pair being equal to the tail current of the second differential pair.

Such an arrangement provides a convenient design enabling a well defined change in the active devices which contribute to the output current with changing common mode input voltage. It is possible to make the tail currents or transconductances of the transistor pairs non-equal depending on the total characteristics required. In this way the amplifier transconductance or slew rate characteristics can be optimised for a given application.

BRIEF DESCRIPTION OF THE DRAWINGS

The above and other features and advantages of the invention will become apparent from the following description, by way of example, of a preferred embodiment of the sole invention with reference to the accompanying drawing which shows a circuit diagram of an amplifier according to the invention.

DESCRIPTION OF THE PREFERRED EMBODIMENTS

As shown in the drawing the amplifier comprises three differential pairs of p-channel field effect transistors P1 to P6 and three differential pairs of n-channel transistors N1 to N6. A first input 1 is connected to the gate electrodes of transistors P1, P3, P5, N1, N3 and N5, while a second input 2 is connected to the gate electrodes of transistors P2, P4 and P6 and N2, N4 and N6. The source electrodes of transistors P1 and P2 are connected in common via a current source 3 to a supply rail $V_{dd}$, the source electrodes of transistors P3 and P4 are connected in common via a current source 4 to the supply rail $V_{dd}$, and the source electrodes of transistor P5 and P6 are connected in common via a current source 5 to the supply rail $V_{dd}$. Similarly the source electrodes of transistors N1 and N2 are connected in common to a supply rail $V_{ss}$ via a current source 6, the source electrodes of transistors N3 and N4 are connected in common to the supply rail $V_{ss}$ via a current source 7, and the source electrodes of transistors N5 and N6 are connected in common to the supply rail $V_{ss}$ via a current source 8. The drain electrodes of transistors P3 and P4 are connected in common to the junction of the source electrodes of transistors N3 and N4, while the drain electrodes of transistors N5 and N6 are connected in common to the junction of the source electrodes of transistors P5 and P6. A summing network 9 has four inputs 10, 11, 12 and 13. The drain electrodes of transistors P2 and P6 are connected in common to the input 10, the drain electrodes of transistors P1 and P5 are connected in common to the input 11, The drain electrodes of transistors N1 and N3 are connected in common to the input 12, and the drain electrodes of transistors N2 and N4 are connected in common to input 13. The output of the summing network 9 is connected to an output 14 of the amplifier. The current sources 3 to 8 each pass the current I.

All the n-channel transistors are of equal size, as are all the p-channel transistors. The width and length of the n and p-channel devices are scaled to obtain the same $g_m$ at the same current.

In the middle region of the common mode input, where both the n and p-channel devices contribute to the output, the output of transistors N1 and N2 are summed in the summing network 9 with the output of transistors P1 and P2. The tail current of transistors N3 and N4, which are connected in parallel with transistors N1 and N2, is sourced from the transistors P3 and P4. Thus transistors N3 and N4 will not contribute to the output since there is no tail current passing through them. Similarly, in parallel with the transistors P1 and P2 are transistors P5 and P6. However, the tail current from transistors P5 and P6 is conducted by the transistors N5 and N6 turning off the transistors P5 and P6. Consequently only transistors P1, P2 ,N1 and N2 contribute to the outputs with tail currents I in each pair and the total tail current summed is 2×I.

If now the input common mode level is close to value of $V_{dd}$ transistors P1, P2, P3 and P4 will be turned off as well as transistors P5 and P6. As a result the tail current sources associated with transistors P1, P2, P3 and P4 will collapse and so there will be no diversion of the tail current from transistors N3 and N4 and these will now contribute to the output. The current source associated with transistors P5 and P6 is not off and still sources the current through transistors N5 and N6. The total output is thus due to transistors N1 and N2, and N3 and N4 each pair operating with a tail current I.

Finally, in the situation where the common mode input signal is near to $V_{ss}$ transistors N1 to N6 will be off and so the current sources feeding transistors N1, N2, N5, and N6 will collapse. Hence there will be no diversion of current away from transistors P5 and P6 and they will now contribute to the output. The current source associated with transistors N3 and N4 remains active and so the total output is due to transistor pairs P1 and P2 and P5 and P6, each operating with the tail current I.

Thus, to summarize when the input voltage is close to the supply rail $V_{dd}$ two transistor pairs, that is transistors N1 and transistor N2, and N3 and N4, produce the output, each pair having a tail current I. When the input signal is near to the supply rail $V_{ss}$ two transistor pairs P1 and P2, and P5 and P6, contribute to the output each pair having the tail current I. When the input signal is intermediate the two supply rails $V_{dd}$ and $V_{ss}$ two pairs again contribute to the output, this time being transistors N1 and N2 and transistors P1 and P2. Thus at all times the same number of transistors, each having the same nominal transconductance and bearing the same tail currents, contribute to the output. As a result the amplifier has a substantially constant $g_m$ and slew rate.

The summing network can be of any convenient form. An appropriate network is a composite folding and current mirror arrangement as shown in the paper by Hogervorst et. al. referred to in the introduction.

The current sources 6 and 7 may be combined into a single current source having a current 2I. Similarly the current sources 3 and 5 may be combined into a single current source. This is particularly so when MOS field effect transistors are used as the amplifying devices as shown in this embodiment. It is not essential that all the current sources 3 to 8 pass the same current I. One possibility would be for sources 3, 4, and 5 to pass the current 2I and sources 1, 2, and 6 to pass the current I. In that case the total tail current contributing to the output would remain at 3I.

Although the embodiment described uses P-channel and N-channel MOS field effect transistors any pairs of complimentary active devices could be used. For example MESFETs or Bipolar transistors. In the latter case it would be preferable to use the separate current sources as shown in the drawings to avoid current hogging when the current source transistors are pushed into saturation.

From reading the present disclosure, other modifications will be apparent to persons skilled in the art. Such modifications may involve other features which are already known in the design and use of electrical or electronic circuits and component parts thereof and which may be used instead of or in addition to features already described herein.

I claim:

1. A differential amplifier comprising:

a pair of differential input terminals;

first, second and third differential pairs of active devices of a first conductivity type having first, second, and third tail currents respectively;

fourth, fifth and sixth differential pairs of active devices of a second conductivity type having fourth, fifth, and sixth tail currents respectively;

each of said differential pairs having inputs coupled to said differential input terminals; and a summing network having inputs coupled to the outputs of the first, third fourth and fifth differential pairs and having an output which constitutes the output of the amplifier;

wherein the outputs of the second differential pair are connected in common to the tail of the fifth differential pair, the outputs of the sixth differential pair are connected in common to the tail of the third differential pair, the tail current of the second differential pair is equal to that of the fifth differential pair, and the tail current of the third differential pair is equal to that of the sixth differential pair.

2. A differential amplifier as claimed in claim 1 in which all the tail currents are equal, all the devices of the first conductivity type are identical, all the devices of the second conductivity type are identical, and the transconductances of the devices of the first conductivity type are equal to the transconductances of the devices of the second conductivity type.

3. An amplifier as claimed in claim 2 wherein the active devices of the first conductivity type are p-channel MOS transistors and the active devices of the second conductivity type are n-channel MOS transistors.

4. An amplifier as claimed in claim 3 in which all of the p-channel transistors are identical, all of the n-channel transistors are identical, and the devices are constructed so that the p-channel devices have the same nominal transconductance as the n-channel devices, the tail current of the third differential pair being equal to half the combined tail current of the first and fifth differential pairs and the tail current of the fourth differential pair being equal to half the combined tail current of the second and sixth differential pairs.

5. An amplifier as claimed in claim 1 wherein the active devices of the first conductivity type are p-channel MOS transistors and the active devices of the second conductivity type are n-channel MOS transistors.

6. An amplifier as claimed in claim 5 in which all of the p-channel transistors are identical, all of the n-channel transistors are identical, and the devices are constructed so that the p-channel devices have the same nominal transconductance as the n-channel devices, the tail current of the third differential pair being equal to half the combined tail current of the first and fifth differential pairs and the tail current of the fourth differential pair being equal to half the combined tail current of the second and sixth differential pairs.

* * * * *